US012707758B2

(12) United States Patent
Li et al.

(10) Patent No.: US 12,707,758 B2
(45) **Date of Patent: *Aug. 11, 2026**

(54) PHOTOVOLTAIC CELL, METHOD FOR MANUFACTURING SAME, AND PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Ruifeng Li, Haining (CN); Wenqi Li, Haining (CN); Yankai Qiu, Haining (CN); Ning Zhang, Haining (CN); Bin Li, Haining (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/057,918

(22) Filed: Feb. 19, 2025

(65) Prior Publication Data

US 2025/0194289 A1 Jun. 12, 2025

Related U.S. Application Data

(63) Continuation of application No. 18/590,798, filed on Feb. 28, 2024, now Pat. No. 12,266,731, which is a (Continued)

(30) Foreign Application Priority Data

Dec. 29, 2020 (CN) ......................... 202011591700.4

(51) Int. Cl.
*H10F 77/30* (2025.01)
*H10F 71/00* (2025.01)

(52) U.S. Cl.
CPC ......... *H10F 77/315* (2025.01); *H10F 71/129* (2025.01); *H10F 77/311* (2025.01)

(58) Field of Classification Search
CPC ..... H10F 77/311; H10F 77/315; H10F 71/129
See application file for complete search history.

(56) References Cited

U.S. PATENT DOCUMENTS

2017/0069778 A1* 3/2017 Kwon .................. H10F 19/906

FOREIGN PATENT DOCUMENTS

CN 109087956 A * 12/2018 .......... H10F 71/129
CN 110735130 A * 1/2020 .......... C23C 16/345

OTHER PUBLICATIONS

Machine translation of CN-109087956-A, Chen, Jian-Sheng. (Year: 2018).*
Machine translation of CN-110735130-A, Guo, Yan. (Year: 2020).*

* cited by examiner

*Primary Examiner* — Mayla Gonzalez Ramos
(74) *Attorney, Agent, or Firm* — USCH Law, PC

(57) ABSTRACT

The photovoltaic cell includes a silicon substrate, a first passivation layer, a second passivation layer, at least one silicon oxynitride layer, and at least one silicon nitride layer. The second passivation layer includes a first silicon oxide layer and at least one aluminum oxide layer, and a thickness of the at least one aluminum oxide layer is in a range of 4 nm to 20 nm. The number of silicon atoms is greater than the number of oxygen atoms in the at least one silicon oxynitride layer and the number of oxygen atoms is greater than the number of nitrogen atoms in the at least one silicon oxynitride layer. The first silicon oxide layer is disposed between the substrate and the at least one aluminum oxide layer, and a thickness of the first silicon oxide layer is in a range of 0.1 nm to 5 nm.

20 Claims, 7 Drawing Sheets

Related U.S. Application Data continuation of application No. 18/336,711, filed on Jun. 16, 2023, now Pat. No. 11,955,571, which is a continuation of application No. 18/146,429, filed on Dec. 26, 2022, now Pat. No. 12,317,637, which is a continuation-in-part of application No. 17/857,169, filed on Jul. 4, 2022, now Pat. No. 11,600,731, which is a continuation of application No. 17/386,442, filed on Jul. 27, 2021, now Pat. No. 11,437,529.

PHOTOVOLTAIC CELL, METHOD FOR MANUFACTURING SAME, AND PHOTOVOLTAIC MODULE

CROSS-REFERENCE TO RELATED APPLICATION

The present application is a continuation of U.S. patent application Ser. No. 18/590,798, filed on Feb. 28, 2024, which is a continuation of U.S. patent application Ser. No. 18/336,711, filed on Jun. 16, 2023, which is a continuation of U.S. patent application Ser. No. 18/146,429, filed on Dec. 26, 2022, which is a continuation in part of U.S. patent application Ser. No. 17/857,169, filed on Jul. 4, 2022, which is a continuation of U.S. patent application Ser. No. 17/386,442, filed on Jul. 27, 2021, which claims the benefit of priority to Chinese Patent Application No. 202011591700.4 filed on Dec. 29, 2020, each of which is incorporated herein by reference in its entirety.

TECHNICAL FIELD

Generally, the present disclosure relates to a photovoltaic field, in particular to a photovoltaic cell, a method for manufacturing the photovoltaic cell and a photovoltaic module.

BACKGROUND

A typical passivated emitter and rear cell (PERC) uses stacked aluminum oxide/silicon nitride as a rear passivation layer. An aluminum oxide layer has a relatively high fixed negative charge density, and a large number of the fixed negative charges may shield electrons on a silicon substrate surface, thus reducing the electrons usable for recombination and achieving suppression of carrier recombination on the surface. The PERC has become a mainstream technology in the photovoltaic cell. However, for a PERC based photovoltaic module, a potential induced degradation (PID) effect may negatively affect the performance of the cell, thus resulting in lowered conversion efficiency. An important cause of the PID effect may be that a potential difference between the cells and other structures (such as a packaging material) of the photovoltaic module disturbs a normal current path in the cells during the power generation, then the photovoltaic cell presents undesirable situations such as power attenuation and lower power generation. Therefore, it is desirable to improve an anti-PID effect of the PERC and maintain high efficiency of the PERC.

SUMMARY

Some embodiments of the present disclosure provide a photovoltaic cell, a method for manufacturing the photovoltaic cell, and a photovoltaic module, which can improve anti-PID performance and power generation efficiency of the photovoltaic cell.

In order to solve the above problems, embodiments of the present disclosure provide a photovoltaic cell, including: a silicon substrate; a first passivation layer disposed on a front surface of the silicon substrate; and a second passivation layer, at least one silicon oxynitride layer, and at least one silicon nitride layer and a silicon oxide layer that are disposed on a rear surface of the silicon substrate in a direction away from the silicon substrate. The second passivation layer includes at least one aluminum oxide layer, and a thickness of the at least one aluminum oxide layer is in the range of 4 nm to 20 nm. A number of silicon atoms is greater than a number of oxygen atoms in the at least one silicon oxynitride layer, the number of oxygen atoms is greater than a number of nitrogen atoms in the at least one silicon oxynitride layer, and a thickness of the at least one silicon oxynitride layer is in the range of 1 nm to 30 nm. A number of silicon atoms is greater than a number of nitrogen atoms in the at least one silicon nitride layer, and a thickness of the at least one silicon nitride layer is in the range of 50 nm to 100 nm. A thickness of the silicon oxide layer is in the range of 0.5 nm to 5 nm.

In some embodiments, a ratio of a number of oxygen atoms to a number of aluminum atoms in the at least one aluminum oxide layer is greater than 0.8 and less than 1.6.

In some embodiments, the second passivation layer further includes another silicon oxide layer disposed between the silicon substrate and the at least one aluminum oxide layer, and a thickness of the another silicon oxide layer is in the range of 0.1 nm to 5 nm.

In some embodiments, the photovoltaic cell further includes another silicon oxide layer disposed between the at least one silicon oxynitride layer and the at least one aluminum oxide layer, and the another silicon oxide layer has a thickness ranged from 0.5 nm to 5 nm.

In some embodiments, a ratio of a number of silicon atoms to a number of nitrogen atoms in the at least one silicon nitride layer is greater than 1 and less than 4.

In some embodiments, the at least one silicon nitride layer includes 2 to 5 silicon nitride layers.

In some embodiments, the at least one silicon nitride layer includes a first silicon nitride layer, a second silicon nitride layer and a third silicon nitride layer stacked in the direction away from the silicon substrate, and a thickness of the first silicon nitride layer is in the range of 5 nm to 20 nm, a thickness of the second silicon nitride layer is in the range of 20 nm to 40 nm, and a thickness of the third silicon nitride layer is in the range of 40 nm to 75 nm.

In some embodiments, the at least one silicon nitride layer includes a first silicon nitride layer and a second silicon nitride layer stacked in the direction away from the silicon substrate, and a thickness of the first silicon nitride layer is in the range of 15 nm to 40 nm, and a thickness of the second silicon nitride layer is in the range of 35 nm to 110 nm.

In some embodiments, a refractive index of the first silicon nitride layer is in the range of 2.1 to 2.5, a refractive index of the second silicon nitride layer is in the range of 2 to 2.3, and a refractive index of the third silicon nitride layer is in the range of 1.9 to 2.1; and refractive indexes of the first silicon nitride layer, the second silicon nitride layer, and the third silicon nitride layer decrease layer by layer in the direction away from the silicon substrate.

In some embodiments, a refractive index of the first silicon nitride layer is in the range of 2.3 to 2.5, and a refractive index of the second silicon nitride layer is in the range of 1.9 to 2.2.

Embodiments of the present disclosure further provide photovoltaic module, including at least one cell string, each of the at least one cell string includes a plurality of photovoltaic cells electrically connected, and each of the plurality of photovoltaic cells includes: a silicon substrate; a first passivation layer disposed on a front surface of the silicon substrate; and a second passivation layer, at least one silicon oxynitride layer, and at least one silicon nitride layer that are disposed on a rear surface of the silicon substrate in a direction away from the silicon substrate. The second passivation layer includes at least one aluminum oxide layer, and a refractive index of the at least one aluminum oxide layer is in the range of 1.4 to 1.6. A number of silicon atoms is greater than a number of oxygen atoms in the at least one silicon oxynitride layer, the number of oxygen atoms is greater than a number of nitrogen atoms in the at least one silicon oxynitride layer, and a refractive index of the at least one silicon oxynitride layer is in the range of 1.5 to 1.8. A number of silicon atoms is greater than a number of nitrogen atoms in the at least one silicon nitride layer, and a refractive index of the at least one silicon nitride layer is in the range of 1.9 to 2.5.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

Figure 1:
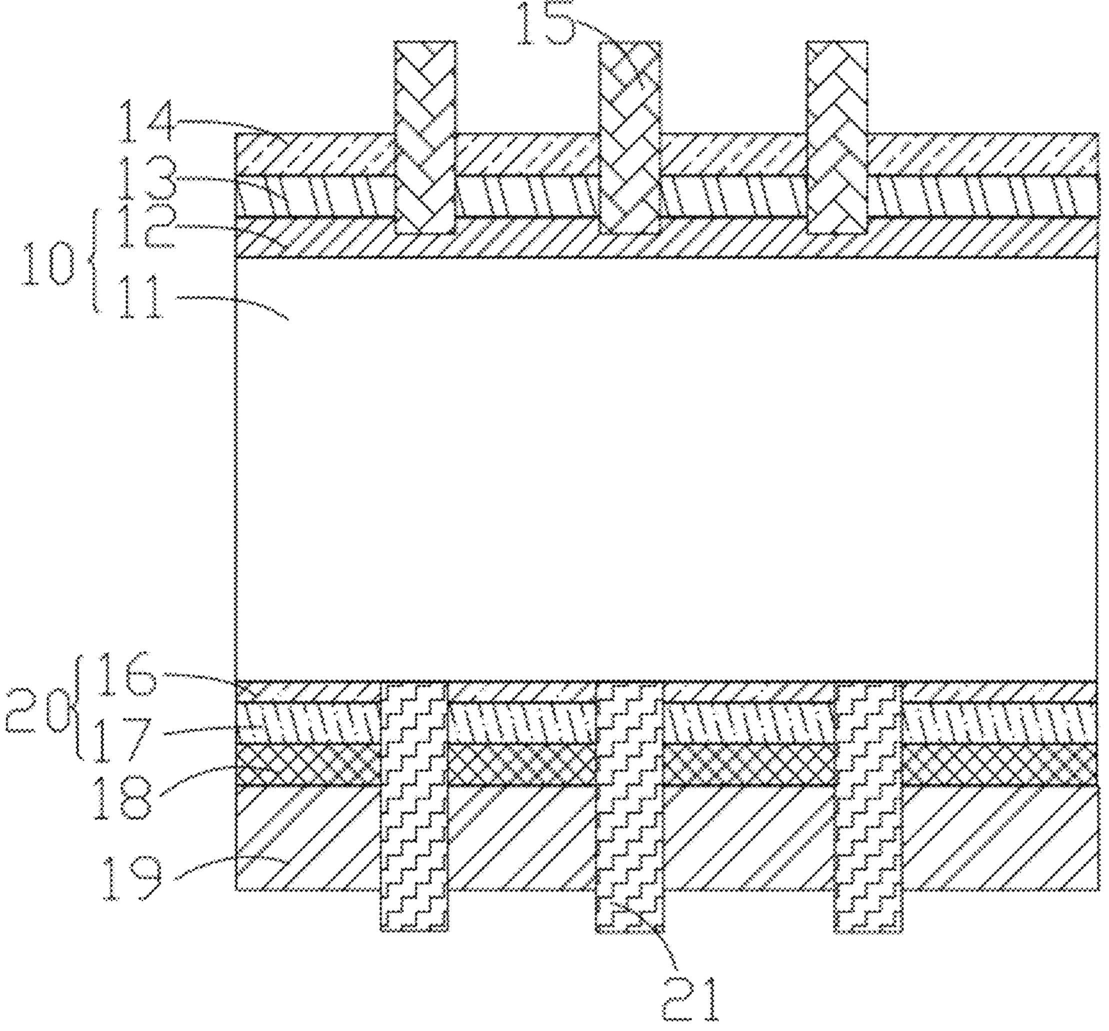
FIG. 1 is a schematic structural diagram of a photovoltaic cell according to some embodiments of the present disclosure.

The embodiments of the present disclosure will be described in detail below with reference to the accompanying drawings in order to make the objectives, technical solutions and advantages of the present disclosure clearer. However, it will be appreciated by those of ordinary skill in the art that, in various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

The present disclosure provides a photovoltaic cell, which includes a substrate; a first passivation layer and a first anti-reflection layer that are sequentially disposed on a front surface of the substrate in a direction away from the substrate; and a second passivation layer, a polarization phenomenon weakening (PPW) layer and at least one silicon nitride layer $Si_uN_v$ that are sequentially disposed on a rear surface of the substrate in a direction away from the substrate, where $1<u/v<4$. The second passivation layer includes at least one aluminum oxide layer $Al_xO_y$, where $0.8<y/x<1.6$ and a refractive index of the at least one aluminum oxide layer is in a range of 1.4 to 1.6, and a thickness of the at least one aluminum oxide layer is in a range of 4 nm to 20 nm. The PPW layer includes at least one silicon oxynitride layer $Si_rO_sN_t$, where $r>s>t$ and a refractive index of the at least one silicon oxynitride layer is in a range of 1.5 to 1.8, and a thickness of the at least one silicon oxynitride layer is in a range of 1 nm to 30 nm. A refractive index of the at least one silicon nitride layer is in a range of 1.9 to 2.5, and a thickness of the at least one silicon nitride layer is in a range of 50 nm to 100 nm.

By disposing the PPW layer including the at least one silicon oxynitride layer between the at least one aluminum oxide layer and the at least one silicon nitride layer, a potential difference between the at least one aluminum oxide layer and the at least one silicon nitride layer may be reduced, and the anti-PID performance of the photovoltaic cell may be improved, thus ensuring the high conversion efficiency of the photovoltaic cell. Furthermore, a refractive index of each layer on the rear surface of the photovoltaic cell is within a reasonable refractive index range by defining a relationship between the atom number of each kind of atoms in the silicon nitride layer, the aluminum oxide layer and the silicon oxynitride layer. When the refractive index of all the layers on the rear surface of the photovoltaic cell is within the reasonable refractive index range and each layer has a suitable thickness, the light utilization rate of the photovoltaic cell can be increased and the light conversion efficiency of the photovoltaic cell can be improved.

Some embodiments of the photovoltaic cell of the present disclosure will be described in detail below. The following contents are merely provided for convenience of understanding the implementation details, and are not necessary for the implementation of the technical solution of the present disclosure.

FIG. 1 is a schematic structural diagram of a photovoltaic cell according to some embodiments of the present disclosure.

As shown in FIG. 1, the photovoltaic cell includes a substrate 10. The substrate 10 includes an intrinsic silicon substrate (or a silicon substrate) 11 and an emitter 12. The intrinsic silicon substrate 11 and the emitter 12 form a PN junction of the photovoltaic cell. For example, the intrinsic silicon substrate 11 may be a P-type substrate, the emitter 12 may be an N-type doped layer, that is, the P-type substrate and the N-type doped layer form a PN junction. As another example, the intrinsic silicon substrate 11 may be an N-type substrate, the emitter 12 may be a P-type doped layer, that is, the N-type substrate and the P-type doped layer form a PN junction. In some embodiments, the intrinsic silicon substrate 11 includes, but is not limited to, a monocrystalline silicon substrate, a polycrystalline silicon substrate, a monocrystalline silicon-like substrate, etc. It should be noted that a front surface of the substrate 10 is designated as a light-receiving surface, and a rear surface of the substrate 10 refers to a surface opposite to the front surface. In some embodiments, a surface close to the emitter 12 is referred to as the front surface, and a surface close to the intrinsic silicon substrate 11 is referred to as the rear surface.

In some embodiments, the emitter 12 and the intrinsic silicon substrate 11 are formed in one original silicon wafer. In some embodiments, the emitter 12 is an additional layer disposed over the front surface of the intrinsic silicon substrate 11. In some embodiments, the emitter 12 is omitted.

The photovoltaic cell further includes a first passivation layer 13 and a first anti-reflection layer 14 that are sequentially disposed on the front surface of the substrate 10 in a direction away from the substrate 10. In some embodiments, the photovoltaic cell further includes a first electrode 15 penetrating through the first passivation layer 13 and the first anti-reflection layer 14 and forming an ohmic contact with the emitter 12 of the substrate 10.

The first passivation layer 13 includes, but is not limited to, a silicon oxide layer, an aluminum oxide layer, a silicon nitride layer, a silicon oxynitride layer, etc. The first passivation layer 13 is configured to reduce the recombination of carriers, thereby increasing an open circuit voltage and a short circuit current of the photovoltaic cell. The first anti-reflection layer 14 may be provided with a layer similar to or substantially the same as the first passivation layer 13, for example, including but not limited to, the silicon oxide layer, the aluminum oxide layer, the silicon nitride layer, the silicon oxynitride layer, etc. The first anti-reflection layer 14 may not only reduce the reflectivity of lights incident on a surface of the photovoltaic cell, but also passivate the surface of the photovoltaic cell. For those skilled in the art, one or both of the first passivation layer 13 and the first anti-reflection layer 14 may be formed by a PECVD process, and one or both of the first passivation layer 13 and the first anti-reflection layer 14 may include hydrogen elements due to the PECVD process.

In some embodiments, the first passivation layer 13 may be a single layer or a multi-layer structure, or the first anti-reflection layer 14 may be a single layer or a multi-layer structure. For example, the first passivation layer 13 may include a silicon oxide layer, the first anti-reflection layer 14 may include a silicon nitride sub-layer and a silicon oxynitride sub-layer. As another example, the first passivation layer 13 may include a silicon oxide layer, the first anti-reflection layer 14 may include a silicon nitride sub-layer, a silicon oxynitride sub-layer and a silicon oxide sub-layer.

The photovoltaic cell further includes a second passivation layer 20, a polarization phenomenon weakening (PPW) layer 18 and a silicon nitride layer 19 that are sequentially disposed on the rear surface of the substrate 10 in a direction away from the substrate 10. In some embodiments, the photovoltaic cell further includes a second electrode 21 penetrating through the second passivation layer 20, the polarization phenomenon weakening layer 18 and the silicon nitride layer 19 and forming an ohmic contact with the substrate 10.

In some embodiments, the second passivation layer 20 includes at least one aluminum oxide layer $Al_xO_y$, where $0.8<y/x<1.6$. Particularly, $0.8<y/x\leq 1$, $1<y/x<1.5$, or $1.5\leq y/x<1.6$. As used herein, x and y denote the number of aluminum atoms and the number of oxygen atoms, respectively, in the at least one aluminum oxide layer. When the at least one aluminum oxide layer is provided with a single layer (i.e., an aluminum oxide layer 17 shown in FIG. 1), a thickness of the aluminum oxide layer 17 is in a range of 4 nm to 20 nm. For example, the thickness of the aluminum oxide layer 17 is 5 nm, 10 nm, 15 nm or 20 nm. When forming the aluminum oxide layer 17 with a particular thickness, a ratio of y and x in the aluminum oxide layer 17 is controlled in a range of 0.8 to 1.6, and a refractive index of the aluminum oxide layer 17 is in a range of 1.4 to 1.65, such as 1.4-1.6. Particularly, the refractive index of the aluminum oxide layer 17 is in a range of 1.55 to 1.59. It should be noted that, when the at least one aluminum oxide layer is provided with a plurality of layers (not shown), the refractive index mentioned here should be a refractive index of all the aluminum oxide layers, that is, the refractive index of all of the plurality of aluminum oxide layers is in a range of 1.4 to 1.65. Particularly, the refractive index of all of the plurality of aluminum oxide layers is in a range of 1.55 to 1.59.

As shown in FIG. 1, the second passivation layer 20 further includes a silicon oxide layer 16. The silicon oxide layer 16 is disposed between the substrate 10 and the aluminum oxide layer 17 to isolate the aluminum oxide layer 17 from the substrate 10, thereby avoiding a direct contact between the aluminum oxide layer 17 and the substrate 10. A dense silicon oxide layer 16 is chemically stable, which may chemically passivate a dangling bond on the surface of the substrate 10. Herein, a thickness of the silicon oxide layer 16 is in a range of 0.1 nm to 5 nm. Particularly, the thickness of the silicon oxide layer 16 is 2 nm, 3 nm or 4 nm.

It is found through an experimental verification that the PID may be improved by 21.2% to 27.7% via providing the silicon oxide layer 16 with a special design (for example, the thickness of the silicon oxide layer 16 is in a range of 0.1 nm to 5 nm) compared with providing a passivation layer without silicon oxide.

The polarization phenomenon weakening layer 18 includes at least one silicon oxynitride layer $Si_rO_sN_t$, where $r>s>t$. As used herein, r, s and t denote the number of silicon atoms, the number of oxygen atoms and the number of nitrogen atoms, respectively, in the at least one silicon oxynitride layer. A concentration of silicon atoms in the at least one silicon oxynitride layer is in a range of $5\times10^{21}/cm^3$ to $2.5\times10^{22}/cm^3$. The PPW layer 18 is configured to reduce a cell difference between layers on two sides of the PPW layer 18, so as to improve the anti-PID effect. In some embodiments, a thickness of the at least one silicon oxynitride layer in the PPW layer 18 is in a range of 1 nm to 30 nm. Particularly, the thickness of the at least one silicon oxynitride layer is 6 nm, 11 nm, 16 nm, 21 nm, 25 nm or 30 nm. When forming the at least one silicon oxynitride layer $Si_rO_sN_t$ with a particular thickness, where $r>s>t$, a refractive index of the at least one silicon oxynitride layer is in a range of 1.5 to 1.8. It should be noted that when the at least one silicon oxynitride layer is provided with a plurality of layers (not shown), the refractive index mentioned here should be a refractive index of all the silicon oxynitride layers, that is, the refractive index of all of the plurality of silicon oxynitride layers is in a range of 1.5 to 1.8.

Figure 6:
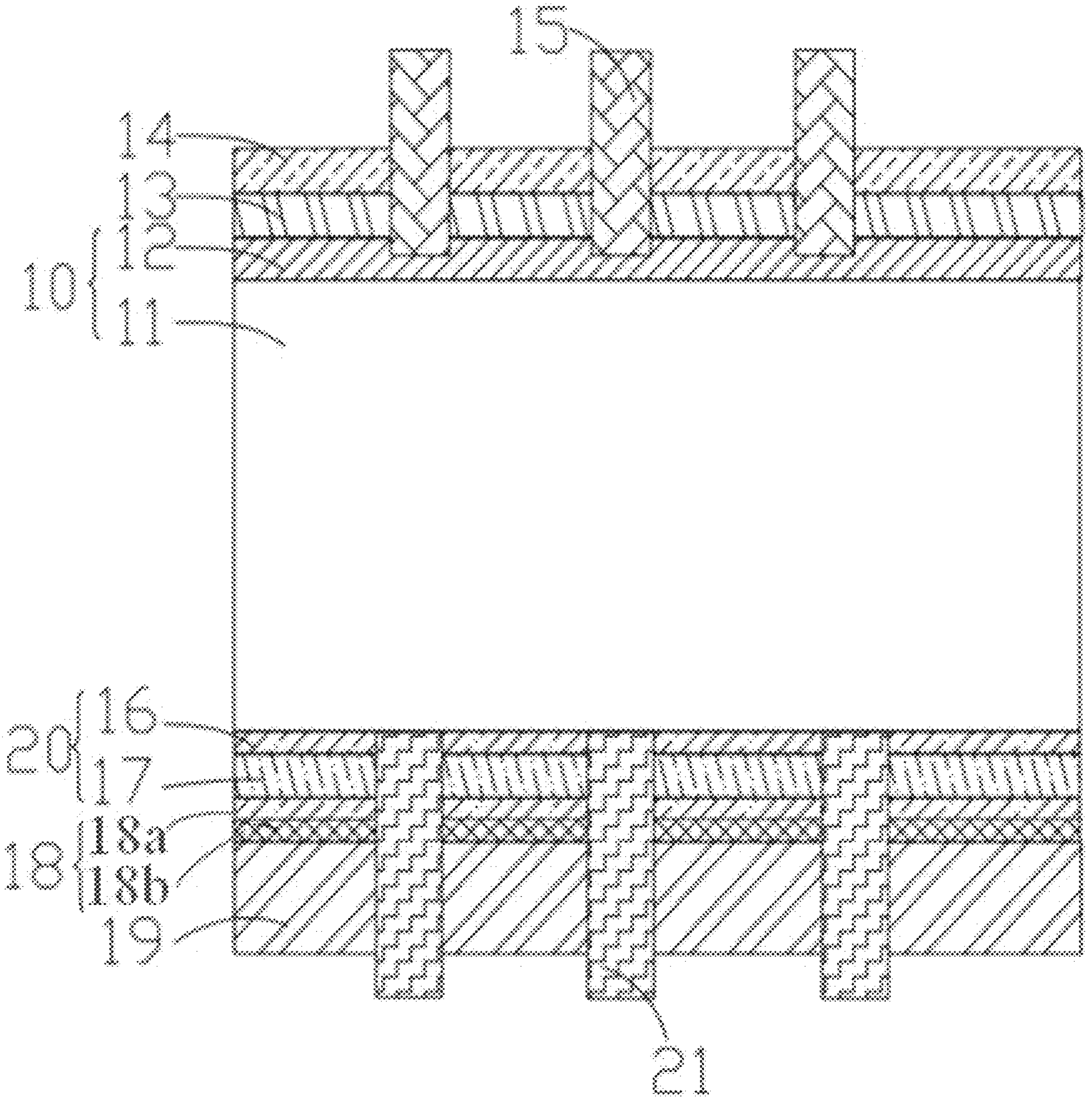
FIG. 6 is yet another schematic structural diagram of a photovoltaic cell according to some embodiments of the present disclosure.
Figure 7:
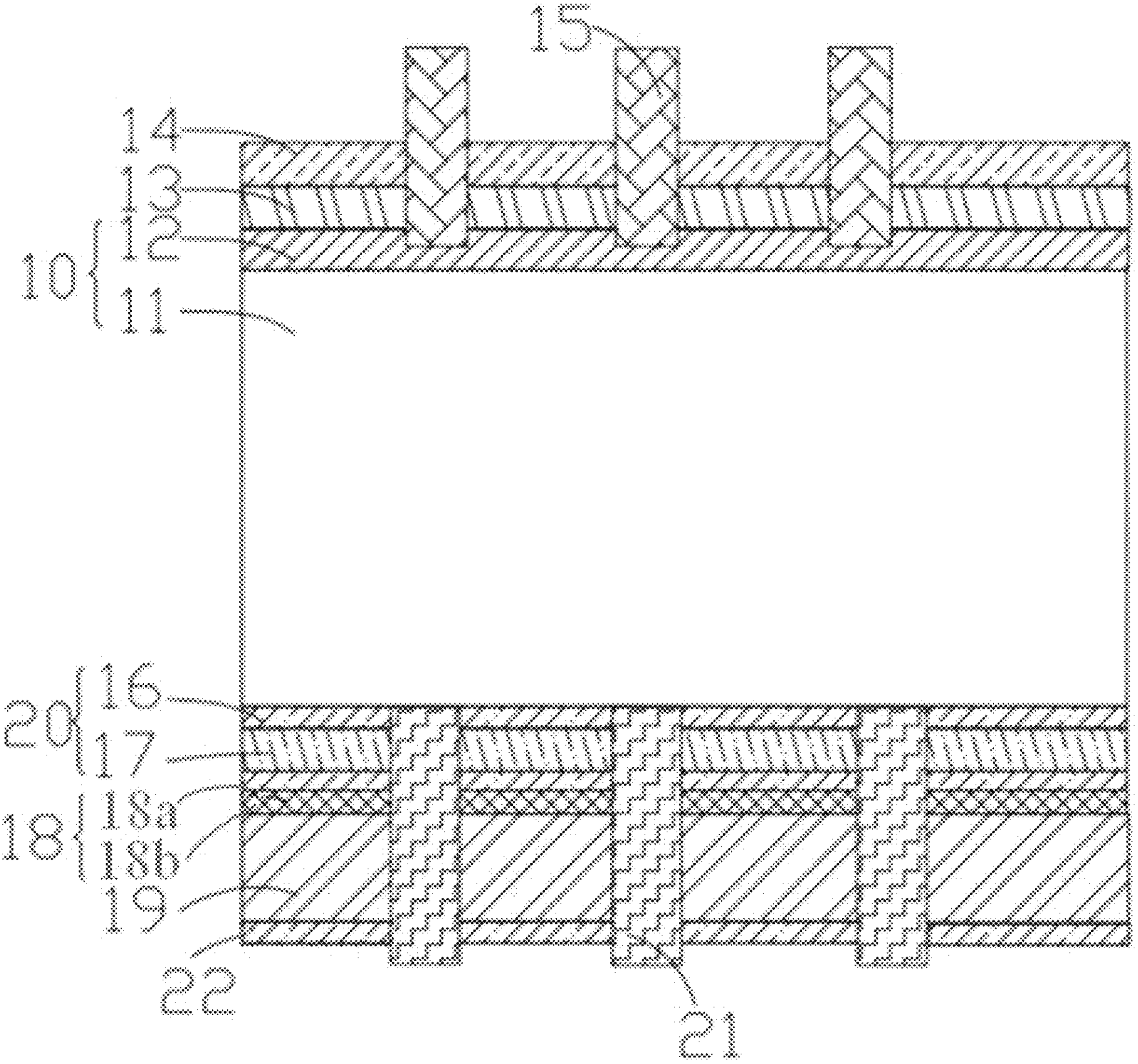
FIG. 7 is still yet another schematic structural diagram of a photovoltaic cell according to some embodiments of the present disclosure.

In some embodiments, as shown in FIGS. 6 and 7, the PPW layer 18 includes a thin silicon oxide layer **18*a* (referred to as a second silicon oxide layer 18*a* different from the silicon oxide layer 16) and at least one silicon oxynitride layer 18*b*. The second silicon oxide layer 18*a* is disposed between the aluminum oxide layer 17 and the at least one silicon oxynitride layer 18*b*. In some embodiments, the second silicon oxynitride layer 18*a* of the PPW layer 18 is formed by depositing an intermediate silicon oxide layer, thus the thin silicon oxide layer 18*a* is formed between the aluminum oxide layer 17 and the silicon oxynitride layer 18*b*. A thickness of the thin silicon oxide layer 18*a* is in a range of 0.5 nm to 5 nm. In some embodiments, the thin silicon oxide layer 18*a*** is formed by an additional oxidation process.

It is found through an experimental verification that the PID may be improved by 42.8% to 69.60% via providing the PPW layer 18 with a specific design (for example, a thickness of the PPW layer is in a range of 1 nm to 30 nm) compared with providing a passivation layer without the PPW layer.

It is found through an experimental verification that, in some embodiments, the PID may be improved by up to 81.6% to 99.00% when the rear surface of the photovoltaic cell is provided with both the silicon oxide layer 16 and the PPW layer 18 for isolation.

In an embodiment, the at least one silicon nitride layer $Si_uN_v$ is provided with a single layer (i.e., the silicon nitride layer 19 shown in FIG. 1), where 1<u/v<4. Particularly, 1<u/v≤2 or 2<u/v<4. As used herein, u and v denote the number of silicon atoms and the number of nitrogen atoms, respectively, in the at least one silicon nitride layer. A thickness of the silicon nitride layer 19 is in a range of 50 nm to 100 nm. Particularly, the thickness of the silicon nitride layer 19 is 60 nm, 75 nm or 90 nm. When forming the silicon nitride layer 19 with a particular thickness, the ratio of u and v in the silicon nitride layer 19 may be controlled in a range of 1 to 4, and a refractive index of the silicon nitride layer 19 is in a range of 1.9 to 2.5. In some embodiments, the at least one silicon nitride layer is provided with a plurality of layers (shown in FIG. 2 and FIG. 3), for example, 2 to 5 layers. Refractive indexes of the plurality of silicon nitride layers decrease layer by layer in the direction away from the substrate 10, but a refractive index of all the silicon nitride layers should be controlled in a range of 1.9 to 2.5. It should be noted that the number of the plurality of silicon nitride layers may be configured according to requirements on the thickness and refractive index of the deposited silicon nitride layer, which is not limited in the present disclosure.

In some embodiments, as shown in FIG. 7, a third silicon oxide layer 22 is disposed on a surface of the silicon nitride layer 19 facing away from the rear surface of the substrate 10. A thickness of the third silicon oxide layer 22 is in a range of 0.5 nm to 5 nm. The number of silicon atoms is not less than the number of oxygen atoms in the third silicon oxide layer 22. In some embodiments, the third silicon oxide layer 22 is omitted.

In order to achieve a photovoltaic cell with high anti-PID effect and high efficiency, for example, the thicknesses of the second passivation layer 20, the PPW layer 18 and the silicon nitride layer 19 on the rear surface of the photovoltaic cell and their corresponding refractive indexes are designed to be matched. The refractive index of all the layers on the rear surface of the photovoltaic cell is within a reasonable refractive index range by defining a relationship of the atom number of each kind of atoms in the aluminum oxide layer 17 included in the second passivation layer 20, the polarization phenomenon weakening layer 18 and the silicon nitride layer 19. When the refractive index of all the layers on the rear surface of the photovoltaic cell is within the reasonable refractive index range and each layer has a suitable thickness, which result in a relatively high anti-reflective property, the light utilization rate of the photovoltaic cell can be increased and the light conversion efficiency of the photovoltaic cell can be improved.

In some embodiments of the present disclosure, the aluminum oxide layer 17 is provided on the rear surface of the photovoltaic cell. Since the growth and annealing temperature of the aluminum oxide layer 17 is relatively low, octahedral structures of aluminum atoms in the aluminum oxide layer 17 will be transformed into tetrahedral structures after a high temperature heat treatment to generate interstitial oxygen atoms. The interstitial oxygen atoms capture valence electrons in the substrate 10 to form fixed negative charges, so that the aluminum oxide layer 17 shows an electronegativity and an interface electric field directed to the inside of the substrate 10 is generated at the interface, thus causing carriers to escape from the interface quickly, reducing an interface recombination rate and increasing a minority carrier lifetime of the substrate 10. The PPW layer 18 disposed on the aluminum oxide layer 17 may effectively prevent subsequent products of sodium ions, ~OH and ~CH3 groups from migrating into the photovoltaic cell, block the movement and migration of mobile ions under an external electric field, temperature and humidity, and reduce the potential difference between layers and enhance the anti-PID effect, thus having better anti-PID performance and anti-aging/attenuation performance. The silicon nitride layer 19 disposed on the PPW layer 18 achieves the optimal anti-reflection effect by combining optical path matching, and protects the adjacent aluminum oxide layer 17 and polarization phenomenon weakening layer 18 from corrosion caused by the excessive paste. After annealing, an H passivation effect of the silicon nitride layer 19 is significant, which further improves the minority carrier lifetime of a silicon wafer and also prevents subsequent products of Na+, ~OH and ~CH3 groups from migrating into the photovoltaic cell to a certain extent, thus avoiding power attenuation caused by electric leakage of cell components. The combination of the aluminum oxide layer 17 and the polarization phenomenon weakening layer 18 reduces the power loss of the cell components, and improves light attenuation performance, heat-assisted light attenuation performance and anti-PID performance of the photovoltaic cell.

Figure 2:
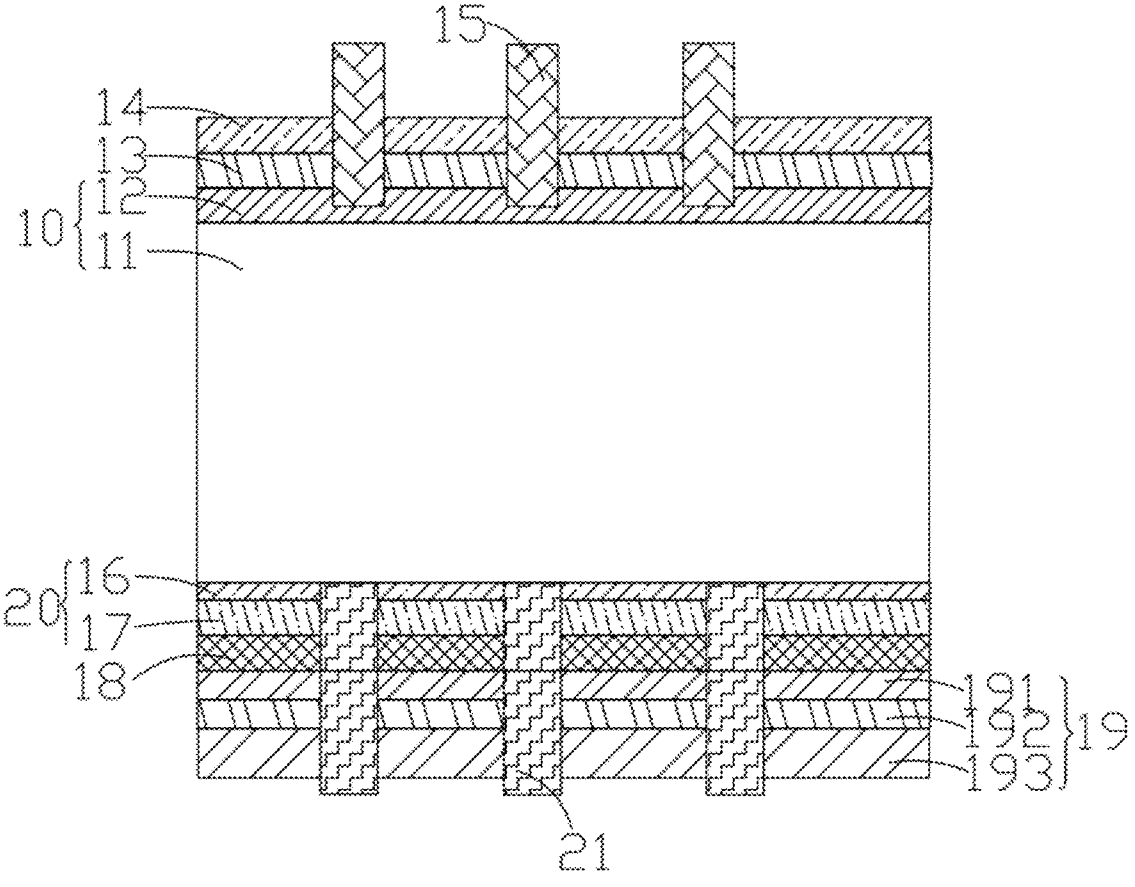
FIG. 2 is another structural diagram of the photovoltaic cell according to some embodiments of the present disclosure.

In an embodiment, as shown in FIG. 2, the at least one silicon nitride layer is provided with three silicon nitride layers, i.e., a first silicon nitride layer 191, a second silicon nitride layer 192 and a third silicon nitride layer 193 that are stacked in the direction away from the substrate 10. In this embodiment, a refractive index of the three and silicon nitride layers is in a range of 1.9 to 2.5. A thickness of the first silicon nitride layer 191 is in a range of 5 nm to 20 nm, a thickness of the second silicon nitride layer 192 is in a range of 20 nm to 40 nm, and a thickness of the third silicon nitride layer 193 is in a range of 40 nm to 75 nm. A refractive index of the first silicon nitride layer 191 is in a range of 2.1 to 2.5, a refractive index of the second silicon nitride layer 192 is in a range of 2 to 2.3, and a refractive index of the third silicon nitride layer 193 is in a range of 1.9 to 2.1. It should be noted that although there are the same values in the refractive index ranges of every two silicon nitride layers in the above three silicon nitride layers, the refractive indexes of the three silicon nitride layers need to satisfy the condition that "the refractive indexes of the plurality of silicon nitride layers decrease layer by layer in the direction away from the substrate 10" in practical applications. Therefore, a situation that every two silicon nitride layers in the three silicon nitride layers have the same refractive indexes may not happen.

Figure 3:
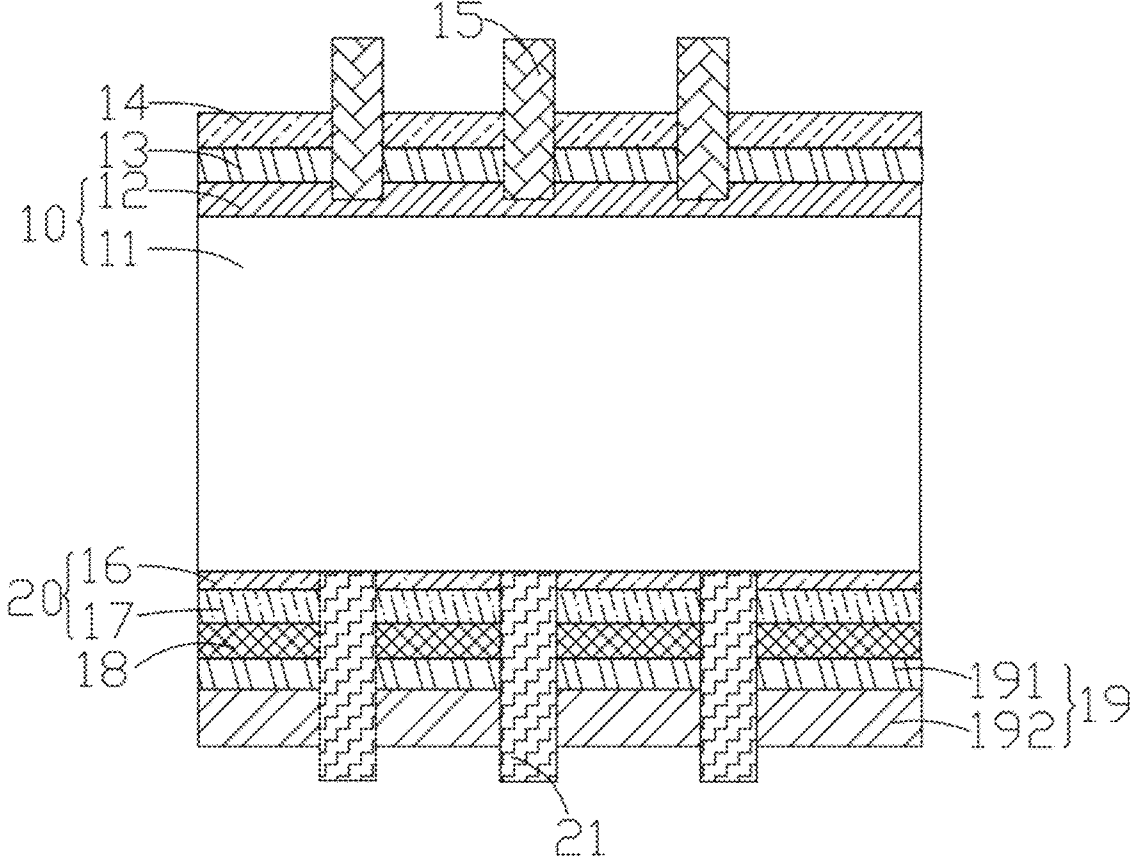
FIG. 3 is still another structural schematic diagram of the photovoltaic cell according to some embodiments of the present disclosure.

In an embodiment, as shown in FIG. 3, the at least one silicon nitride layer is provided with two silicon nitride layers, i.e., a first silicon nitride layer 191 and a second silicon nitride layer 192 that are stacked in the direction away from the substrate 10. In this embodiment, a refractive index of the two silicon nitride layers is in a range of 1.9 to 2.5. A thickness of the first silicon nitride layer 191 is in a range of 15 nm to 40 nm, and a thickness of the second silicon nitride layer 192 is in a range of 35 nm to 110 nm. A refractive index of the first silicon nitride layer 191 is in a range of 2.3 to 2.5, and a refractive index of the second silicon nitride layer 192 is in a range of 1.9 to 2.2.

Some embodiments of the present disclosure provide a photovoltaic module, which includes at least one photovoltaic cell string. The photovoltaic cell string is composed of the above photovoltaic cells electrically connected, for example, the photovoltaic cells illustrated in FIGS. 1 to 3. The photovoltaic cells are electrically connected in series and/or parallel in the photovoltaic cell string. The photovoltaic module includes, but is not limited to, a laminate module, a double-sided module, a multi-main grid module, etc. For example, the photovoltaic cells (e.g., FIG. 1) described above can be obtained, and the cells can be electrically connected with adjacent ones via conductive materials to form the cell string. A back plate, an ethylene-vinyl acetate (EVA) copolymer and the cell string are stacked in a certain order through a lamination process. Then the stacked structure is installed with a frame to form the photovoltaic module. The photovoltaic cells may convert absorbed light energy into electric energy. The module may transfer the electric energy obtained by the cells to a load.

Figure 4:
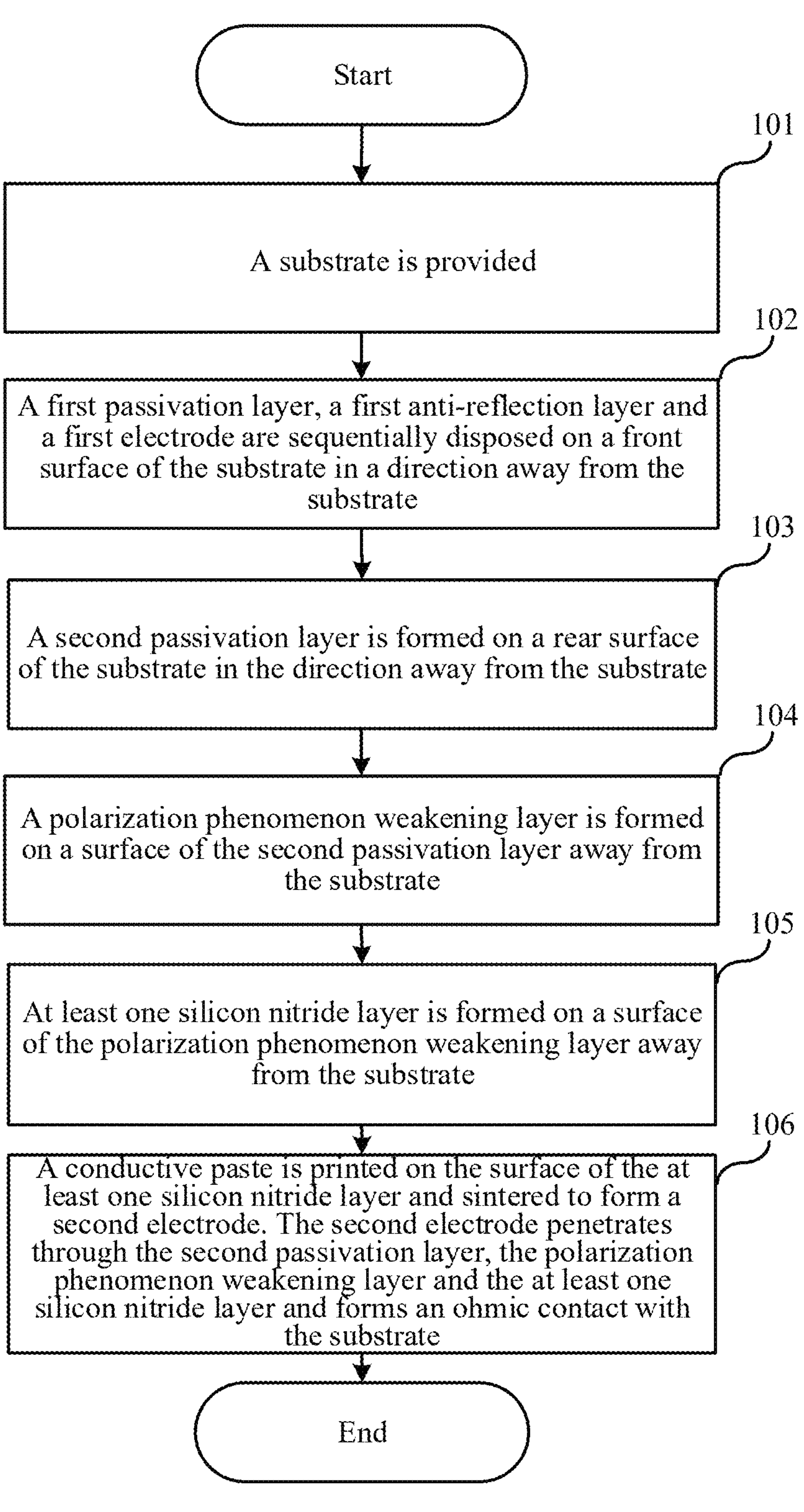
FIG. 4 is a schematic flow chart of a method for manufacturing a photovoltaic cell according to some embodiments of the present disclosure.

Some embodiments of the present disclosure provide a method for manufacturing the photovoltaic cell described in the above embodiments. A schematic flow chart of the method for manufacturing the photovoltaic cell is shown in FIG. 4, which includes the following steps.

In step 101, a substrate is provided.

Specifically, the substrate includes an intrinsic silicon substrate and an emitter. The intrinsic silicon substrate and the emitter form a PN junction of the photovoltaic cell. As shown in FIGS. 1 to 3, the substrate 10 includes an intrinsic silicon substrate 11 and an emitter 12. The intrinsic silicon substrate 11 and the emitter 12 form a PN junction. For example, the intrinsic silicon substrate 11 may be a P-type substrate, the emitter 12 may be an N-type doped layer, that is, the P-type substrate and the N-type doped layer form a PN junction. In some embodiments, the intrinsic silicon substrate 11 includes, but is not limited to, a monocrystalline silicon substrate, a polycrystalline silicon substrate, a monocrystalline silicon-like substrate, etc. It should be noted that a front surface of the substrate 10 is designated as a light-receiving surface, and a rear surface of the substrate 10 refers to a surface opposite to the front surface. In some embodiments, a surface close to the emitter 12 is referred to as the front surface, and a surface close to the intrinsic silicon substrate 11 is referred to as the rear surface.

In step 102, a first passivation layer, a first anti-reflection layer and a first electrode are sequentially disposed on a front surface of the substrate in a direction away from the substrate.

As shown in FIGS. 1 to 3, a first passivation layer 13 and a first anti-reflection layer 14 are sequentially stacked on the front surface of the substrate 10 in the direction away from the substrate 10. Herein, the first passivation layer 13 includes, but is not limited to, an aluminum oxide layer, a silicon nitride layer, a silicon oxynitride layer, etc. The first passivation layer 13 is used to reduce the recombination of carriers, thereby increasing an open circuit voltage and a short circuit current of the photovoltaic cell. The first anti-reflection layer 14 may be provided with a layer similar to or substantially the same as the passivation layer 13, for example, including but not limited to, the aluminum oxide layer, the silicon nitride layer, the silicon oxynitride layer, etc. The first anti-reflection layer 14 may not only reduce the reflectivity of lights incident on a surface of the photovoltaic cell, but also passivate the surface of the photovoltaic cell.

The first passivation layer 13 or the first anti-reflection layer 14 may be formed by, including but not limited to, plasma enhanced chemical vapor deposition (PECVD), atomic layer deposition (ALD), chemical vapor deposition (CVD), physical vapour deposition (PVD), etc.

In an embodiment, a first electrode 15 is further formed on the front surface of the substrate 10. The first electrode 15 penetrates through the first passivation layer 13 and the first anti-reflection layer 14, and forms an ohmic contact with the emitter 12 of the substrate 10. The first electrode 15 may be formed by a metallization process, for example, by screen printing the conductive paste.

In step 103, a second passivation layer is formed on a rear surface of the substrate in the direction away from the substrate.

As shown in FIGS. 1 to 3, a second passivation layer 20 is formed on the rear surface of the substrate 10. The second passivation layer 20 includes at least one aluminum oxide layer $Al_xO_y$, where $0.8<y/x<1.6$. Particularly, $0.8<y/x\leq 1$, $1<y/x<1.5$ or $1.5\leq y/x<1.6$. When the at least one aluminum oxide layer is provided with a single layer (i.e., an aluminum oxide layer 17), a thickness of the aluminum oxide layer 17 is in a range of 4 nm to 20 nm. Particularly, the thickness of the aluminum oxide layer 17 is 5 nm, 10 nm, 15 nm or 20 nm. When forming the aluminum oxide layer 17 with a particular thickness, a ratio of y and x in the aluminum oxide layer 17 is controlled in a range of 0.8 to 1.6, and a refractive index of the aluminum oxide layer 17 is in a range of 1.4 to 1.6. Particularly, the refractive index of the aluminum oxide layer 17 is in a range of 1.55 to 1.59. It should be noted that when the at least one aluminum oxide layer is provided with a plurality of layers (not shown), the refractive index mentioned here should be a refractive index of all the aluminum oxide layers, that is, the refractive index of all of the plurality of aluminum oxide layers is in a range of 1.4 to 1.6. Particularly, the refractive index of all of the plurality of aluminum oxide layers is in a range of 1.55 to 1.59.

In an embodiment, the aluminum oxide layer 17 in the second passivation layer 20 is prepared by the PECVD. Argon, trimethylaluminium and nitrous oxide may be used as precursors of the aluminum oxide layer 17. Herein, a gas flow ratio of the argon, the trimethylaluminium and the nitrous oxide is in a range of 1:1:1 to 1.5:1:2. Particularly, the gas flow ratio is in a range of 1:1:1 to 1:1:2, and the pressure in a PECVD reaction chamber is 0.13 mbar. A thickness of the aluminum oxide layer 17 is in a range of 4 nm to 20 nm. A ratio of y and x in the aluminum oxide layer 17 may be controlled in a range of 0.8 to 1.6. A refractive index of the aluminum oxide layer 17 is in a range of 1.4 to 1.65.

In an embodiment, the second passivation layer 20 further includes a silicon oxide layer 16. The silicon oxide layer 16 is disposed between the substrate 10 and the aluminum oxide layer 17. The silicon oxide layer 16 is formed between the substrate 10 and the aluminum oxide layer 17 to isolate the aluminum oxide layer 17 from the substrate 10. The silicon oxide layer 16 is formed by applying an ozone ($O_3$) process in a process of etching the substrate 10. The dense silicon oxide layer 16 is chemically stable, which may chemically passivate a dangling bond on the surface of the substrate 10. A thickness of the silicon oxide layer 16 is in a range of 0.1 nm to 5 nm. Particularly, the thickness of the silicon oxide layer 16 is 2 nm, 3 nm or 4 nm.

In step 104, a polarization phenomenon weakening (PPW) layer is formed on a surface of the second passivation layer away from the substrate.

The PPW layer may be configured as an intermediate layer to reduce a potential difference between its upper and lower layers, thus improving the anti-PID performance of the photovoltaic cell and further ensuring the high conversion efficiency of the photovoltaic cell. In some embodiments, as shown in FIGS. 1 to 3, the PPW layer 18 includes at least one silicon oxynitride layer $Si_rO_sN_t$, where $r>s>t$. A concentration of silicon atoms in the at least one silicon oxynitride layer is in a range of $5\times10^{21}/cm^3$ to $2.5\times10^{22}/cm^3$.

In an embodiment, when depositing the at least one silicon oxynitride layer on the surface of the aluminum oxide layer 17, silanes, ammonia and nitrous oxide are simultaneously introduced into a reaction chamber, where a gas flow ratio of the silanes, the ammonia and the nitrous oxide is in a range of 1:1:3 to 1:4:6, and the pressure in the reaction chamber is 0.25 mbar. A thickness of the at least one silicon oxynitride layer is in a range of 1 nm to 30 nm, and a refractive index of the at least one silicon oxynitride layer is in a range of 1.5 to 1.8. It should be noted that when the at least one silicon oxynitride layer is provided with a plurality of layers, the refractive index mentioned here should be a refractive index of all the silicon oxynitride layers, that is, the refractive index of all of the plurality of silicon oxynitride layers is in a range of 1.5 to 1.8.

In an embodiment, an intermediate silicon oxide layer is deposited on the surface of the aluminum oxide layer 17, and precursors of the intermediate silicon oxide layer are the silanes and the nitrous oxide, where a gas flow ratio of the silanes and the nitrous oxide is in a range of 1:3 to 1:6, and the pressure in the reaction chamber is 0.25 mbar. After the intermediate silicon oxide layer is formed, nitrogen source gas is introduced to produce nitrogen plasmas to react with the intermediate silicon oxide layer, so as to form the at least one silicon oxynitride layer. That is to say, an intermediate silicon dioxide layer is formed first by the reaction on the surface of the aluminum oxide layer 17, and then the nitrogen source gas is introduced to produce nitrogen plasmas to react with the silicon dioxide layer, so as to form the at least one silicon oxynitride layer. A thickness of the at least one silicon oxynitride layer is in a range of 1 nm to 30 nm, and the refractive index of the at least one silicon oxynitride layer is in a range of 1.5 to 1.8.

In step 105, at least one silicon nitride layer is formed on a surface of the polarization phenomenon weakening layer away from the substrate.

As shown in FIG. 1, the at least one silicon nitride layer $Si_uN_v$ is provided with a single layer (i.e., the silicon nitride layer 19), where $1<u/v<4$, and the silicon nitride layer 19 is formed on the surface of the PPW layer 18. A thickness of the silicon nitride layer 19 is in a range of 50 nm to 100 nm.

In an embodiment, the silicon nitride layer 19 is prepared by the PECVD, the silanes and the ammonia may be used as precursors of the silicon nitride layer 19. The pressure in the reaction chamber is 0.25 mbar, and a gas flow ratio of the silanes and the ammonia is in a range of 1:1.3 to 1:4. A thickness of the silicon nitride layer 19 is in a range of 50 nm to 100 nm, and a refractive index of the silicon nitride layer 19 is in a range of 1.9 to 2.5. Particularly, the thickness of the silicon nitride layer 19 is 60 nm, 75 nm or 90 nm.

In an embodiment, the at least one silicon nitride layer is provided with a plurality of silicon nitride layers. Particularly, the at least one silicon nitride layer is provided with 2 to 5 silicon nitride layers, such as 2 layers, 3 layers, etc. As shown in FIG. 2, the at least one silicon nitride layer includes a first silicon nitride layer 191, a second silicon nitride layer 192 and a third silicon nitride layer 193. Specifically, precursors of the three silicon nitride layers are introduced into a first reaction chamber of a PECVD equipment, and the precursors are the silanes and the ammonia. A gas flow ratio of the silanes and the ammonia is in a range of 1:1.3 to 1:1.5, the pressure in the first reaction chamber is 0.25 mbar, and the first silicon nitride layer 191 is formed by the PECVD process. The same kind of precursors are continuously introduced into the first reaction chamber, a gas flow ratio of the silanes and the ammonia is in a range of 1:1.5 to 1:2.2, the pressure in the first reaction chamber is 0.25 mbar, and the second silicon nitride layer 192 is formed by the PECVD process. The same kind of precursors are introduced into a second reaction chamber of the PECVD equipment, a gas flow ratio of the silanes and the ammonia is in a range of 1:2.2 to 1:4, the pressure in the reaction chamber is 0.25 mbar, and the third silicon nitride layer 193 is formed by the PECVD process.

Based on the preparation processes, a thickness of the first silicon nitride layer 191 is in a range of 5 nm to 20 nm, a thickness of the second silicon nitride layer 192 is in a range of 20 nm to 40 nm, and a thickness of the third silicon nitride layer 193 is in a range of 40 nm to 75 nm. A refractive index of the first silicon nitride layer 191 is in a range of 2.1 to 2.5, a refractive index of the second silicon nitride layer 192 is in a range of 2 to 2.3, and a refractive index of the third silicon nitride layer 193 is in a range of 1.9 to 2.1. A refractive index of the three silicon nitride layers is in a range of 1.9 to 2.5. It should be noted that although there are the same values in the refractive index ranges of every two silicon nitride layers in the above three silicon nitride layers, the refractive indexes of the three silicon nitride layers need to satisfy the condition that "the refractive indexes of the plurality of silicon nitride layers decrease layer by layer in the direction away from the substrate 10" in practical applications. Therefore, a situation that every two silicon nitride layers in the three silicon nitride layers have the same refractive indexes may not happen.

In an embodiment, as shown in FIG. 3, the at least one silicon nitride layer is provided with two silicon nitride layers, i.e., a first silicon nitride layer 191 and a second silicon nitride layer 192. Specifically, precursors of the two silicon nitride layers are introduced into a first reaction chamber of a PECVD equipment, and the reactants are the silanes and the ammonia. A gas flow ratio of the silanes and the ammonia is 1:1.9, a reaction chamber pressure is 0.25 mbar, and the first silicon nitride layer 191 is formed by the PECVD process. The same kind of precursors are continuously introduced into the first reaction chamber, a gas flow ratio of the silanes and the ammonia is 1:2.8, a reaction chamber pressure is 0.25 mbar, and the second silicon nitride layer 192 is formed by the PECVD process.

Based on the above preparation processes, a thickness of the first silicon nitride layer 191 is in a range of 15 nm to 40 nm, and a thickness of the second silicon nitride layer 192 is in a range of 35 nm to 110 nm. A refractive index of the first silicon nitride layer 191 is in a range of 2.3 to 2.5, and a refractive index of the second silicon nitride layer 192 is in a range of 1.9 to 2.2.

In step 106, a conductive paste is printed on the surface of the at least one silicon nitride layer and sintered to form a second electrode. The second electrode penetrates through the second passivation layer, the PPW layer and the at least one silicon nitride layer, and forms an ohmic contact with the substrate.

In order to achieve a photovoltaic cell with high anti-PID effect and high efficiency, for example, the thicknesses of the second passivation layer 20, the PPW layer 18 and the silicon nitride layer 19 on the rear surface of the photovoltaic cell and their corresponding refractive indexes are designed to be matched. A relationship of the atom number of each kind of atoms in the aluminum oxide layer 17 included in the second passivation layer 20, the PPW layer 18 and the silicon nitride layer 19 is specified through a proper process, so that the refractive index of all the layers on the rear surface of the photovoltaic cell is within a reasonable refractive index range. When the refractive index of all the layers on the rear surface of the photovoltaic cell is within the reasonable refractive index range and each layer has a suitable thickness, which result in a relatively high anti-reflective property, the light utilization rate of the photovoltaic cell can be increased and the light conversion efficiency of the photovoltaic cell can be improved.

In some embodiments of the present disclosure, the aluminum oxide layer 17 is provided on the rear surface of the photovoltaic cell. Since the growth and annealing temperature of the aluminum oxide layer 17 is relatively low, octahedral structures of aluminum atoms in the aluminum oxide layer 17 will be transformed into tetrahedral structures after a high temperature heat treatment to generate interstitial oxygen atoms. The interstitial oxygen atoms capture valence electrons in the substrate 10 to form fixed negative charges, so that the aluminum oxide layer 17 shows an electronegativity and an interface electric field directed to the inside of the substrate 10 is generated at the interface, thus causing carriers to escape from the interface quickly, reducing an interface recombination rate and increasing a minority carrier lifetime of the substrate 10. The PPW layer 18 disposed on the aluminum oxide layer 17 may effectively prevent subsequent products of sodium ions, ~OH and ~CH3 groups from migrating into the photovoltaic cell, block the movement and migration of mobile ions under an external electric field, temperature and humidity, and reduce the potential difference between layers and enhance the anti-PID effect, thus having better anti-PID performance and anti-aging/attenuation performance. The silicon nitride layer 19 disposed on the PPW layer 18 achieves the optimal anti-reflection effect by combining optical path matching, and protects the adjacent aluminum oxide layer 17 and polarization phenomenon weakening layer 18 from corrosion caused by the excessive paste. After annealing, an H passivation effect of the silicon nitride layer 19 is significant, which further improves the minority carrier lifetime of a silicon wafer and also prevents subsequent products of Na+, ~OH and ~CH3 groups from migrating into the photovoltaic cell to a certain extent, thus avoiding power attenuation caused by electric leakage of cell components. The combination of the aluminum oxide layer 17 and the polarization phenomenon weakening layer 18 reduces the power loss of the cell components, and improves light attenuation performance, heat-assisted light attenuation performance and anti-PID performance of the photovoltaic cell.

Comparative Example

Figure 5:
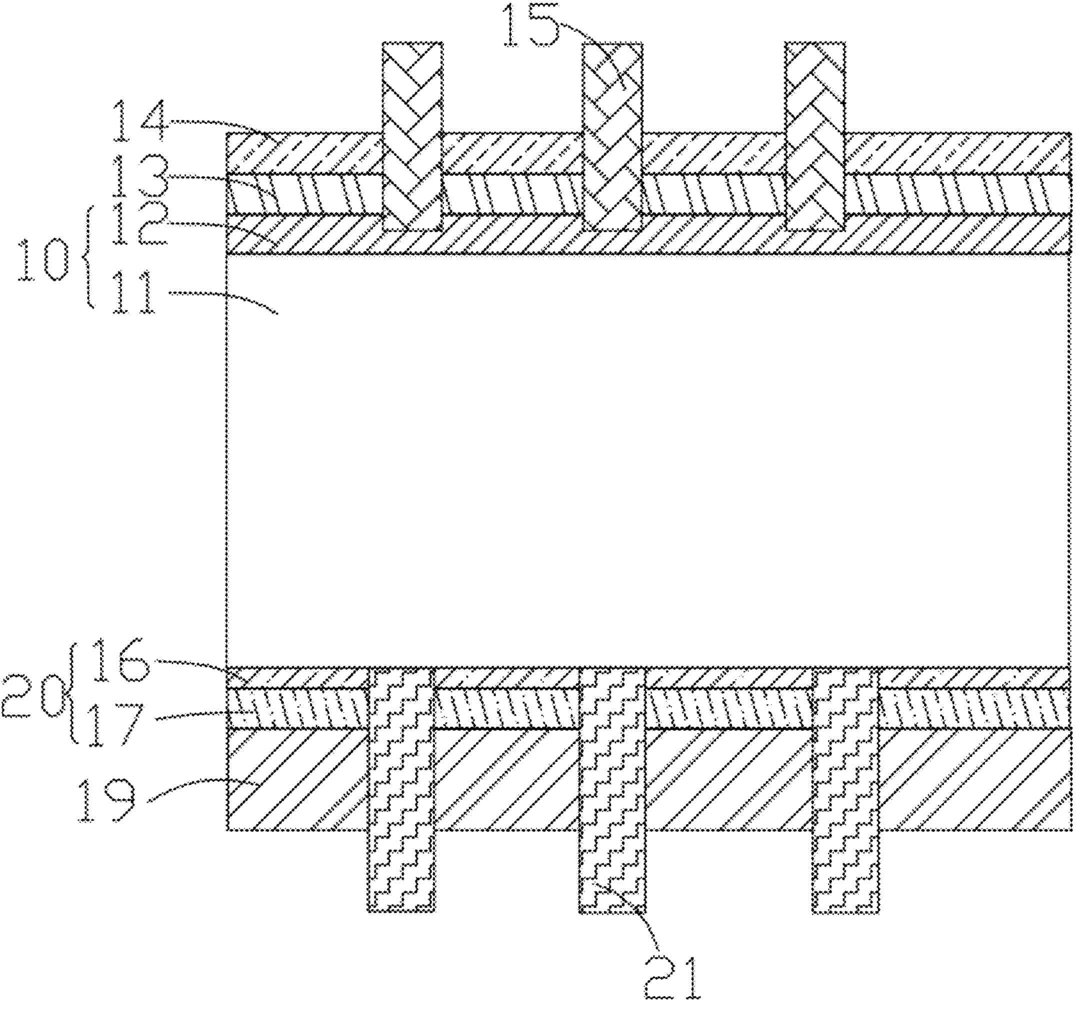
FIG. 5 is a schematic structural diagram of a photovoltaic cell according to a comparative example provided in the present disclosure.

A comparative example provides a back structure of a PERC cell. The specific structure is shown in FIG. 5, which includes: a substrate 10 having a PN junction; a first passivation layer 13, a first anti-reflection layer 14 and a first electrode 15 that are sequentially disposed on a front surface of the substrate 10 in a direction away from the substrate 10; a second passivation layer 20, a silicon nitride layer 19 $Si_uN_v$ and a second electrode 21 that are sequentially disposed on a rear surface of the substrate 10 in a direction away from the substrate 10, where $1<u/v<4$. The second passivation layer 20 includes at least one aluminum oxide layer $Al_xO_y$ (shown as an aluminum oxide layer 17 in FIG. 5 when provided with a single layer), where $0.8<y/x<1.6$. A refractive index of the at least one aluminum oxide layer is in a range of 1.4 to 1.6, and a thickness of the at least one aluminum oxide layer is in a range of 4 nm to 20 nm. A refractive index of the silicon nitride layer 19 is in a range of 1.9 to 2.5, and a thickness of the silicon nitride layer 19 is in a range of 50 nm to 100 nm. The second passivation layer 20 further includes a silicon oxide layer 16. The silicon oxide layer 16 is disposed between the substrate 10 and the aluminum oxide layer 17 to isolate the aluminum oxide layer 17 from the substrate 10, which may avoid a direct contact between the aluminum oxide layer 17 and the substrate 10.

Compared with the photovoltaic cell in the present disclosure shown in FIG. 1, the difference is that the back structure of the comparative example does not have the PPW layer 18, and other structures and preparation method are the same. Through a comparative experiment, the results are shown in the following table.

| Parameter | Conversion efficiency Ncell/% | Open circuit voltage Uoc/mV | Short circuit current Isc/A | Parallel resistance Rs/mΩ | Fill factor FF/% |
|---|---|---|---|---|---|
| With $Si_rO_sN_t$ | 22.897 | 688.2 | 10.761 | 0.988 | 82.677 |
| Without $Si_rO_sN_t$ | 22.779 | 685.6 | 10.752 | 0.955 | 82.626 |

| Parameter | Thickness of layer | Minority carrier lifetime (before sintering) | Minority carrier lifetime (after sintering) |
|---|---|---|---|
| With $Si_rO_sN_t$ | 97 | 128.71 | 204.93 |
| Without $Si_rO_sN_t$ | 84.8 | 93.91 | 168.3 |

Herein, the conversion efficiency of the photovoltaic cell=(open circuit voltage*short circuit current*fill factor)/(cell area*illumination amplitude)*100%. It can be seen that the open circuit voltage, the short circuit current and the fill factor are proportional to the conversion efficiency. The longer the minority carrier lifetime, the higher the conversion efficiency. It can be seen from the data in the table that a conversion efficiency of a photovoltaic cell with the $Si_rO_sN_t$ on the rear surface is 0.118% higher than that of a photovoltaic cell without the $Si_rO_sN_t$ on the rear surface.

The steps in the above methods only aim to make the description clearer. In implementation, the steps may be combined into one or one step may be divided into multiple sub-steps, which, as long as the same logical relationship is included, all fall into the protection scope of the present disclosure. Such a trivial amendment or design added to an algorithm or procedure as not changing the algorithm or a core design of the procedure falls into the protection scope of the disclosure.

It is not difficult to find that this embodiment is a method embodiment related to the first embodiment, and this embodiment may be implemented in cooperation with the first embodiment. The relevant technical details mentioned in the first embodiment are still valid in this embodiment, thus not repeated herein in order to reduce repetition. Accordingly, the relevant technical details mentioned in this embodiment may also be applied in the first embodiment.

Those skilled in the art should appreciate that the aforementioned embodiments are specific embodiments for implementing the present disclosure. In practice, however, various changes may be made in the forms and details of the specific embodiments without departing from the spirit and scope of the present disclosure.

What is claimed is:

1. A photovoltaic cell, comprising:
- a silicon substrate;
- a first passivation layer formed on a front surface of the silicon substrate; and
- a second passivation layer formed over a rear surface of the silicon substrate;
- at least one silicon oxynitride layer formed over the second passivation layer;
- at least one silicon nitride layer formed over the at least one silicon oxynitride layer; and
- a silicon oxide layer formed over the at least one silicon nitride layer;
- wherein the second passivation layer includes at least one aluminum oxide layer, and a thickness of the at least one aluminum oxide layer is in the range of 4 nm to 20 nm;
- wherein the at least one silicon oxynitride layer has a first number of silicon atoms, a second number of oxygen atoms and a third number of nitrogen atoms, the first number is greater than the second number, the second number is greater than the third number, and a thickness of the at least one silicon oxynitride layer is in the range of 1 nm to 30 nm;
- wherein the at least one silicon nitride layer has a fourth number of silicon atoms and a fifth number of nitrogen atoms, the fourth number is greater than the fifth number, and a thickness of the at least one silicon nitride layer is in the range of 50 nm to 100 nm; and
- wherein a thickness of the silicon oxide layer is in the range of 0.5 nm to 5 nm.

2. The photovoltaic cell according to claim 1, wherein a ratio of a number of oxygen atoms to a number of aluminum atoms in the at least one aluminum oxide layer is greater than 0.8 and less than 1.6.

3. The photovoltaic cell according to claim 1, wherein the second passivation layer further includes another silicon oxide layer formed between the silicon substrate and the at least one aluminum oxide layer, and a thickness of the another silicon oxide layer is in the range of 0.1 nm to 5 nm.

4. The photovoltaic cell according to claim 1, further including another silicon oxide layer formed between the at least one silicon oxynitride layer and the at least one aluminum oxide layer, wherein the another silicon oxide layer has a thickness ranged from 0.5 nm to 5 nm.

5. The photovoltaic cell according to claim 1, wherein a ratio of the fourth number to the fifth number is greater than 1 and less than 4.

6. The photovoltaic cell according to claim 5, wherein the at least one silicon nitride layer includes 2 to 5 silicon nitride layers.

7. The photovoltaic cell according to claim 6, wherein the at least one silicon nitride layer includes a first silicon nitride layer, a second silicon nitride layer and a third silicon nitride layer stacked in the direction away from the silicon substrate, and wherein a thickness of the first silicon nitride layer is in the range of 5 nm to 20 nm, a thickness of the second silicon nitride layer is in the range of 20 nm to 40 nm, and a thickness of the third silicon nitride layer is in the range of 40 nm to 75 nm.

8. The photovoltaic cell according to claim 6, wherein the at least one silicon nitride layer includes a first silicon nitride layer and a second silicon nitride layer stacked in the direction away from the silicon substrate, and wherein a thickness of the first silicon nitride layer is in the range of 15 nm to 40 nm, and a thickness of the second silicon nitride layer is in the range of 35 nm to 110 nm.

9. The photovoltaic cell according to claim 7, wherein a refractive index of the first silicon nitride layer is in the range of 2.1 to 2.5, a refractive index of the second silicon nitride layer is in the range of 2 to 2.3, and a refractive index of the third silicon nitride layer is in the range of 1.9 to 2.1; and
- wherein refractive indexes of the first silicon nitride layer, the second silicon nitride layer, and the third silicon nitride layer decrease layer by layer in the direction away from the silicon substrate.

10. The photovoltaic cell according to claim 8, wherein a refractive index of the first silicon nitride layer is in the range of 2.3 to 2.5, and a refractive index of the second silicon nitride layer is in the range of 1.9 to 2.2.

11. A photovoltaic module, comprising at least one cell string, wherein each of the at least one cell string includes a plurality of photovoltaic cells electrically connected, and wherein each of the plurality of photovoltaic cells includes:
- a silicon substrate;
- a first passivation layer formed on a front surface of the silicon substrate; and
- a second passivation layer formed over a rear surface of the silicon substrate;
- at least one silicon oxynitride layer formed over the second passivation layer;
- at least one silicon nitride layer formed over the at least one silicon oxynitride layer; and
- a silicon oxide layer formed over the at least one silicon nitride layer;
- wherein the second passivation layer includes at least one aluminum oxide layer, and a thickness of the at least one aluminum oxide layer is in the range of 4 nm to 20 nm;
- wherein the at least one silicon oxynitride layer has a first number of silicon atoms, a second number of oxygen atoms and a third number of nitrogen atoms, the first number is greater than the second number, the second number is greater than the third number, and a thickness of the at least one silicon oxynitride layer is in the range of 1 nm to 30 nm;
- wherein the at least one silicon nitride layer has a fourth number of silicon atoms and a fifth number of nitrogen atoms, the fourth number is greater than the fifth number, and a thickness of the at least one silicon nitride layer is in the range of 50 nm to 100 nm; and
- wherein a thickness of the silicon oxide layer is in the range of 0.5 nm to 5 nm.

12. The photovoltaic module according to claim 11, wherein a ratio of a number of oxygen atoms to a number of aluminum atoms in the at least one aluminum oxide layer is greater than 0.8 and less than 1.6.

13. The photovoltaic module according to claim 11, wherein the second passivation layer further includes another silicon oxide layer formed between the silicon substrate and the at least one aluminum oxide layer, and a thickness of the another silicon oxide layer is in the range of 0.1 nm to 5 nm.

14. The photovoltaic module according to claim 11, further including another silicon oxide layer formed between the at least one silicon oxynitride layer and the at least one aluminum oxide layer, wherein the another silicon oxide layer has a thickness ranged from 0.5 nm to 5 nm.

15. The photovoltaic module according to claim 11, wherein a ratio of the fourth number to the fifth number is greater than 1 and less than 4.

16. The photovoltaic module according to claim 15, wherein the at least one silicon nitride layer includes 2 to 5 silicon nitride layers.

17. The photovoltaic module according to claim 16, wherein the at least one silicon nitride layer includes a first silicon nitride layer, a second silicon nitride layer and a third silicon nitride layer stacked in the direction away from the silicon substrate, and wherein a thickness of the first silicon nitride layer is in the range of 5 nm to 20 nm, a thickness of the second silicon nitride layer is in the range of 20 nm to 40 nm, and a thickness of the third silicon nitride layer is in the range of 40 nm to 75 nm.

18. The photovoltaic module according to claim 16, wherein the at least one silicon nitride layer includes a first silicon nitride layer and a second silicon nitride layer stacked in the direction away from the silicon substrate, and wherein a thickness of the first silicon nitride layer is in the range of 15 nm to 40 nm, and a thickness of the second silicon nitride layer is in the range of 35 nm to 110 nm.

19. The photovoltaic module according to claim 17, wherein a refractive index of the first silicon nitride layer is in the range of 2.1 to 2.5, a refractive index of the second silicon nitride layer is in the range of 2 to 2.3, and a refractive index of the third silicon nitride layer is in the range of 1.9 to 2.1; and wherein refractive indexes of the first silicon nitride layer, the second silicon nitride layer, and the third silicon nitride layer decrease layer by layer in the direction away from the silicon substrate.

20. The photovoltaic module according to claim 18, wherein a refractive index of the first silicon nitride layer is in the range of 2.3 to 2.5, and a refractive index of the second silicon nitride layer is in the range of 1.9 to 2.2.

* * * * *